United States Patent
Wang et al.

(10) Patent No.: US 8,207,517 B2
(45) Date of Patent: Jun. 26, 2012

(54) PHOTO INTERRUPTER

(75) Inventors: Chin-Hsu Wang, Taipei County (TW); Chih-Hao Hsu, Taipei County (TW); Chun-Chih Liang, Taipei County (TW)

(73) Assignee: Everlight Electronics Co., Ltd., New Taipei (TW)

( * ) Notice: Subject to any disclaimer, the term of this patent is extended or adjusted under 35 U.S.C. 154(b) by 420 days.

(21) Appl. No.: 12/496,918

(22) Filed: Jul. 2, 2009

(65) Prior Publication Data
US 2010/0224801 A1    Sep. 9, 2010

(30) Foreign Application Priority Data
Mar. 3, 2009   (TW) ............................. 98106807 A

(51) Int. Cl.
*G02B 27/00*    (2006.01)

(52) U.S. Cl. ............ 250/551; 250/239; 257/81; 257/99

(58) Field of Classification Search ............... 250/551, 250/239; 257/81, 82, 99, 433, 678; 385/92
See application file for complete search history.

(56) References Cited

U.S. PATENT DOCUMENTS

| | | | | |
|---|---|---|---|---|
| 5,365,062 A | * | 11/1994 | Saffari et al. | 250/239 |
| 5,898,172 A | * | 4/1999 | Masui et al. | 250/239 |
| 6,459,099 B1 | * | 10/2002 | Sano | 257/82 |
| 7,719,023 B2 | * | 5/2010 | Oshio | 257/99 |

FOREIGN PATENT DOCUMENTS

| | | |
|---|---|---|
| CN | 2379816 Y | 5/2000 |
| CN | 2632879 Y | 8/2004 |

* cited by examiner

*Primary Examiner* — Kevin Pyo

(57) ABSTRACT

A photo interrupter is provided. The photo interrupter includes a housing and a light emitting/receiving unit. The housing defines a recess portion and has a first engaging portion disposed in the recess portion. The light emitting/receiving unit has a second engaging portion. When the light emitting/receiving unit is disposed in the recess portion, the first engaging portion engages with the second engaging portion.

12 Claims, 4 Drawing Sheets

US 8,207,517 B2

PHOTO INTERRUPTER

This Application claims priority of Taiwan Patent Application No. 098106807, filed on Mar. 3, 2009, the entirety of which is incorporated by reference herein.

BACKGROUND OF THE INVENTION

1. Field of the Invention

The invention relates to a photo interrupter, and in particular, to a photo interrupter having efficient assembly.

2. Description of the Related Art

A photo interrupter is composed of a light emitting member and a light receiving member. The light emitting member emits light, and the light is received by the light receiving member to generate collector current. When an object passes between the light emitting member and the light receiving member, the collector current is reduced because the object disrupts the light. Thus, the object is detected by collector current changes.

The light emitting/receiving members are usually formed by dual in-line package (DIP) or surface mounting technology (SMT). In the DIP Process, the components are first placed on the substrate, and then they are welded manually to be fixed on the substrate. Thus, imprecise welding may occur due to human error, decreasing quality. In the SMT Process, the light emitting/receiving members are directly adhered to the substrate, and then placed in different housings. Next, the two different housings are adhered to form a complete photo interrupter. However, the SMT manufacturing process is relatively complicated.

In view of this, it is highly desirable in the art to provide a photo interrupter having efficient assembly, wherein formation of the light emitting/receiving members and the housing is accomplished efficiently, without possibility for human error, increasing manufacturing yields.

BRIEF SUMMARY OF THE INVENTION

One objective of this invention is to provide a photo interrupter. The photo interrupter includes a housing and a light emitting/receiving unit. The housing defines a recess portion and has a first engaging portion disposed in the recess portion. The light emitting/receiving unit has a second engaging portion. When the light emitting/receiving unit is disposed in the recess portion, the first engaging portion engages with the second engaging portion. The photo interrupter further includes a first limiting portion and a second limiting portion disposed on the hosing and abutted to the light emitting/receiving unit.

Thus, the photo interrupter of the invention forms the light emitting/receiving members and the housing efficiently, by using the first engaging portion, the second engaging portion, the first limiting portion and the second limiting portion.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
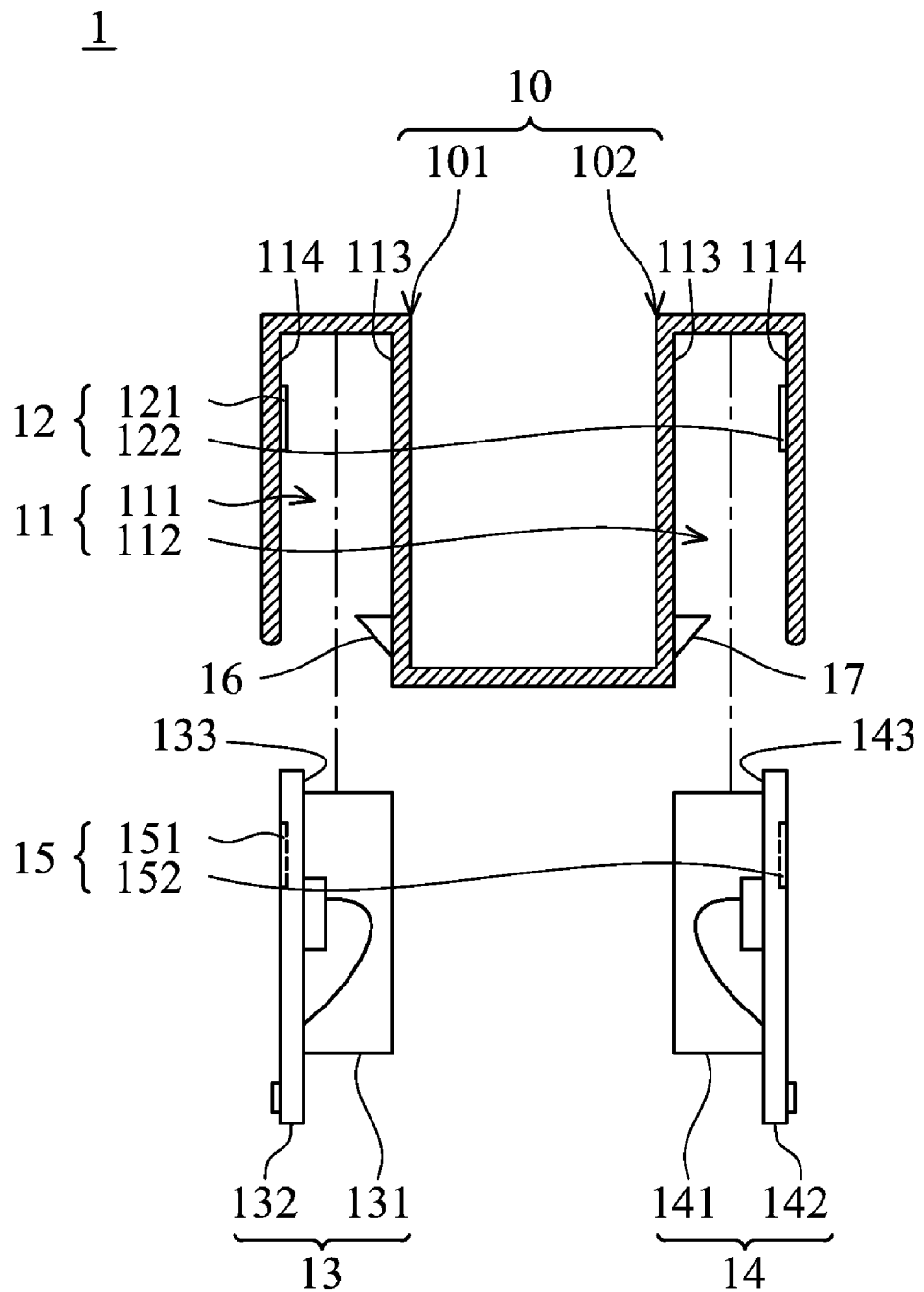
FIG. 1 is a schematic view of a photo interrupter of the invention.
Figure 2:
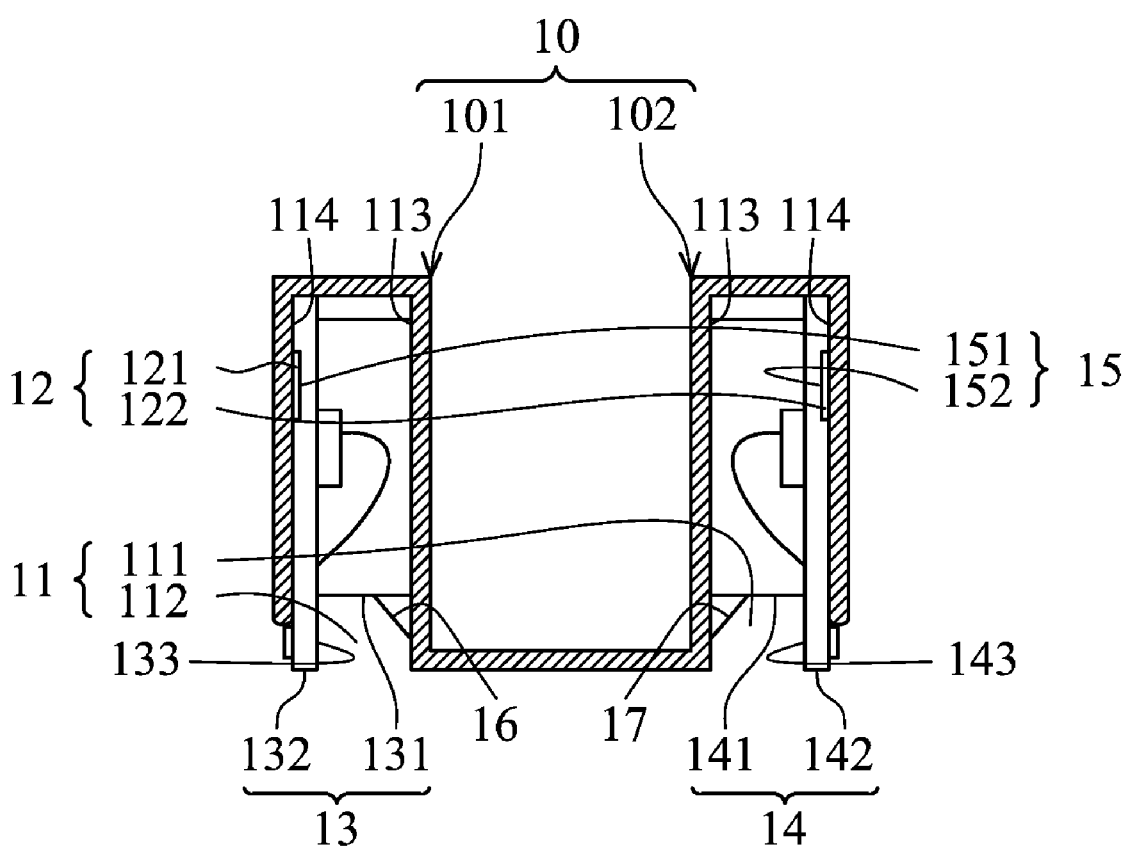
FIG. 2 is a schematic view of the photo interrupter of the invention.

FIG. 1 and FIG. 2 are schematic views of a photo interrupter of the invention. Referring to FIGS. 1 and 2, the photo interrupter 1 comprises a housing 10 and a light emitting/receiving unit.

The housing 10 is formed integrally as a single piece and comprises a recess portion 11 and a first engaging portion 12. The housing 10 comprises a first housing 101 and a second housing 102. The first housing 101 and the second hosing 102 respectively define a first recess 111 and a second recess 112. Each of the first recess 111 and second recess 112 comprises a first surface 113 and a second surface 114 opposite to the first surface 113. The first engaging portion 12 comprises a first sub-engaging member 121 and a second sub-engaging member 122, respectively disposed on the second surface 114 of the first recess 111 and second surface 114 of the second recess 112.

The light emitting/receiving unit comprises a light emitting member 13, a light receiving member 14 and a second engaging portion 15. The light emitting member 13 comprises a light emitting chip assembly 131 and a first substrate 132. The light emitting chip assembly 131 comprises an infrared LED, surface mounted on the first substrate 132. The light receiving member 14 comprises a light receiving chip assembly 141 and a second substrate 142. The light receiving chip assembly 141 comprises a photo transistor, surface mounted on the second substrate 142. The second engaging portion 15 comprises a third sub-engaging member 151 and a fourth sub-engaging member 152. The third sub-engaging member 151 is disposed on a surface 133 of the first substrate 132 of the light emitting member 13, and the fourth sub-engaging member 152 is disposed on a surface 143 of the second substrate 142 of the light receiving member 14.

Referring to FIG. 2, when the light emitting/receiving unit is disposed in the housing 10, the light emitting member 13 and the light receiving member 14 are respectively and correspondingly disposed in the first recess 111 and the second recess 112 of the housing 10.

In detail, when the light emitting member 13 is disposed in the first recess 111, the first sub-engaging member 121 engages with the third sub-engaging member 151, the light emitting chip assembly 131 of the light emitting member 13 contacts the first surface 113 of the first recess 111, and the surface 133 of the first substrate 132 of the light emitting member 13 contacts the second surface 114 of the first recess 111. When the light receiving member 14 is disposed in the second recess 112, the second sub-engaging member 122 engages with the fourth sub-engaging member 152, the light receiving chip assembly 141 of the light receiving member 14 contacts the first surface 113 of the second recess 112, and the surface 143 of the second substrate 142 contacts the second surface 114 of the second recess 112.

Referring to FIG. 1 and FIG. 2, the photo interrupter 1 further comprises a first limiting portion 16 and a second limiting portion 17, respectively disposed on the housing 10. When the light emitting member 13 is disposed in the first recess 111, the first limiting portion 16 abuts the light emitting chip assembly 131 of the light emitting member 13 to limit the movement of the light emitting member 13. When the light receiving member 14 is disposed in the second recess 112, the second limiting portion 17 abuts the light receiving chip assembly 141 of the light receiving member 14 to limit the movement of the light receiving member 14.

Figure 3:
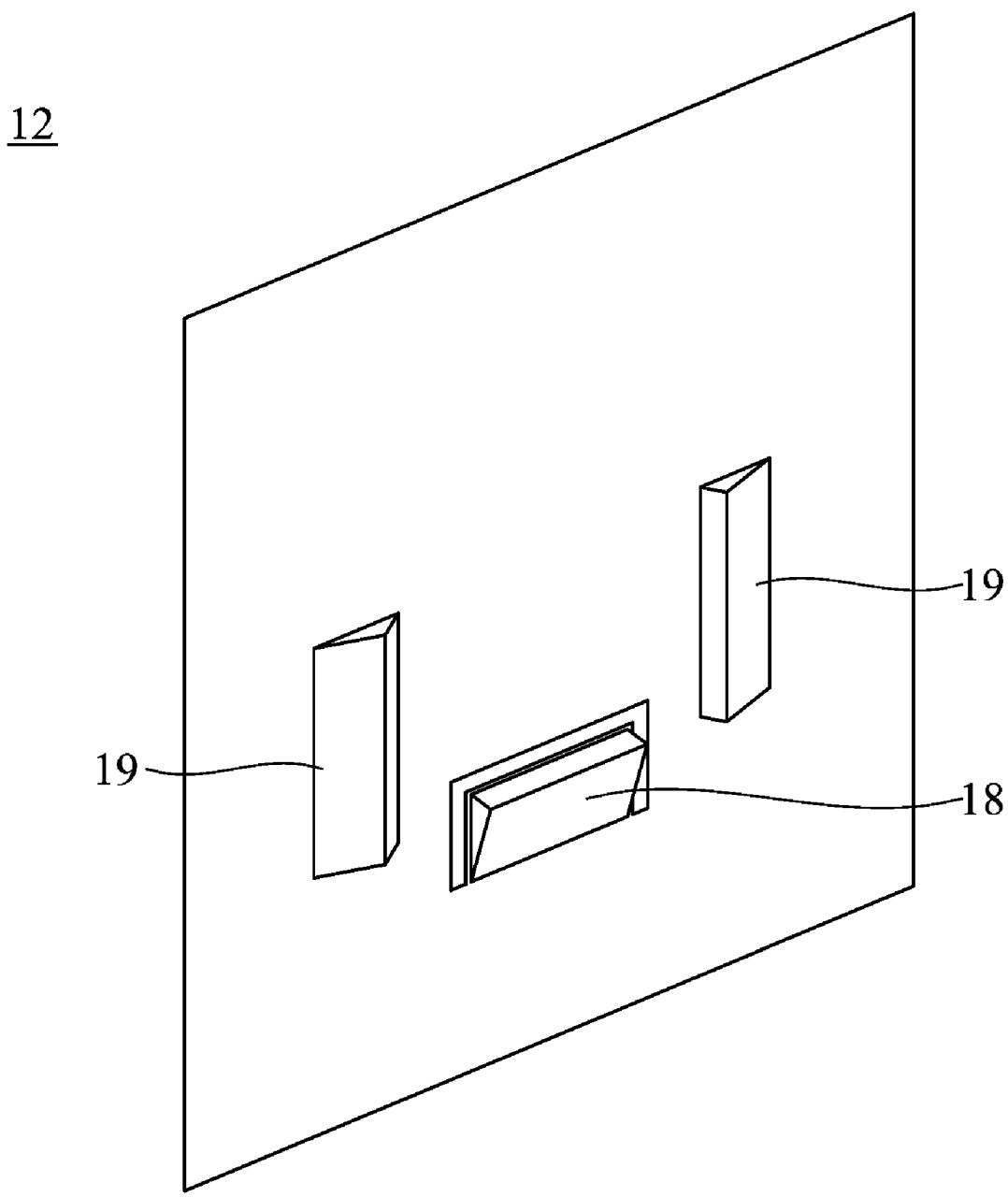
FIG. 3 is a schematic view of the structure of a first engaging portion of the invention.
Figure 4:
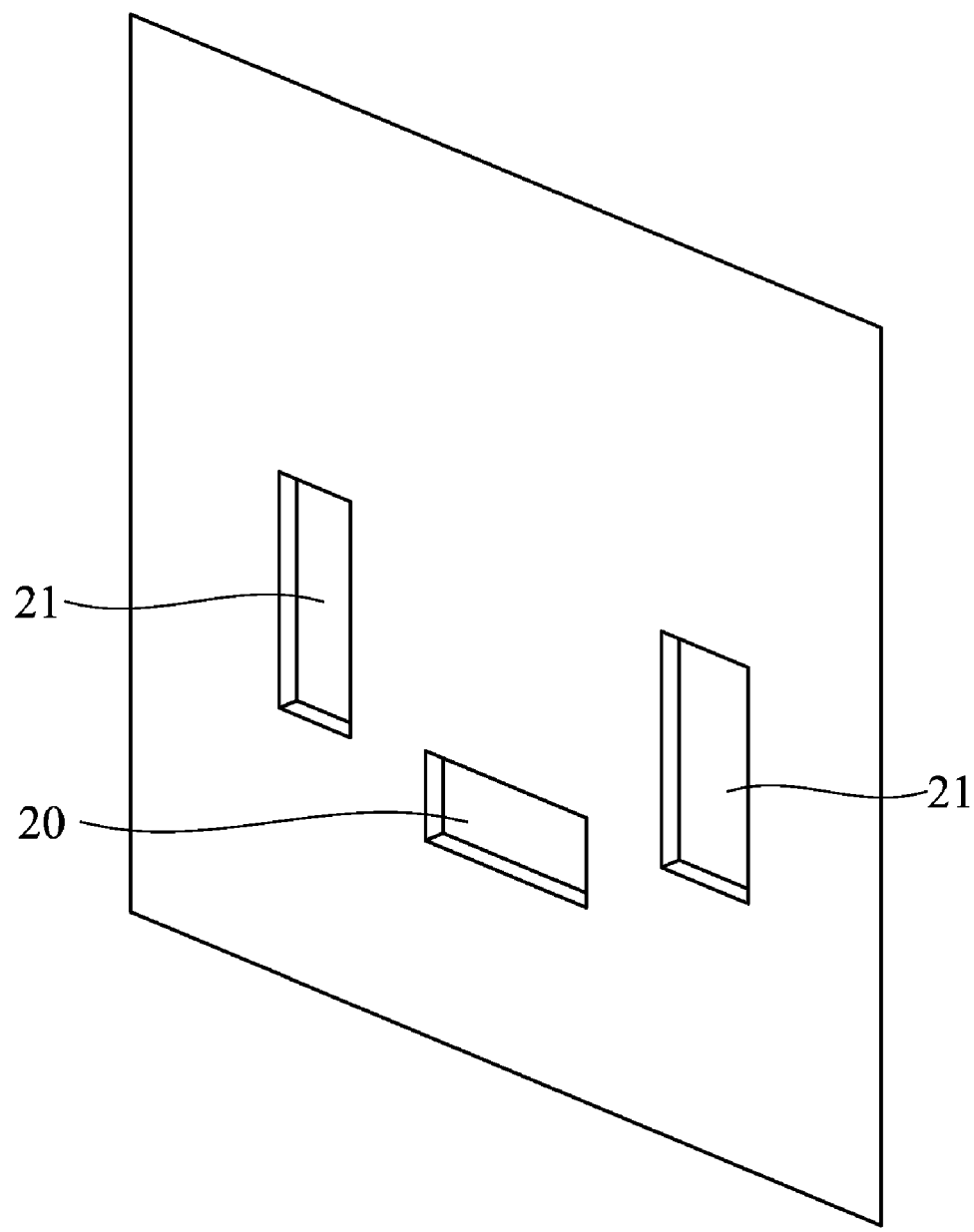
FIG. 4 is a schematic view of the structure of a second engaging portion of the invention.

FIG. 3 is a schematic view showing the structure of the first engaging portion of the invention and FIG. 4 is a schematic view showing the structure of the second engaging portion of the invention. The first engaging portion 12 (the first sub-engaging member 121 and the second sub-engaging member 122) comprises a hook 18 or a protrusion 19, and the second engaging portion (the third sub-engaging member 151 and the fourth sub-engaging member 152) comprises a notch 20 to match with the hook 18, or a track 21 to match with the protrusion 19. Otherwise, the first engaging portion 12 may comprise a hook 18 and a pair of protrusions 19, simultaneously (as shown in FIG. 3), and the second engaging portion 15 may comprises a notch 20 and a pair of tracks 21, simultaneously (as shown in FIG. 4). However, the form of engagement is not limited thereto, as long as the first engaging member 12 firmly engages with the second engaging member 15.

In the photo interrupter 1 of the embodiment, the light emitting member 13 and the light receiving member 14 are directly embedded in the first recess 111 and the second recess 112, respectively. Through engagement between the first engaging portion 12 and the second engaging portion 15 and the tight limiting mechanism of the first limiting portion 16 and the second limiting portion 17, the light emitting member 13 and the light receiving member 14 can be stably disposed in the housing 10. Moreover, because the light emitting/receiving members 13, 14 are first formed by a surface mounting process, and then are embedded in the housing 10, the manufacturing process is simplified, offering automatic production capability.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A photo interrupter, comprising:
    a housing, comprising a first engaging portion, a first housing, and a second housing, wherein the first engaging portion comprises a first sub-engaging portion and a second sub-engaging portion respectively disposed in the first and second housings, and the first and second housings respectively define a first recess and a second recess;
    a light emitting/receiving unit, comprising a second engaging portion, a light emitting member disposed in the first recess, and a light receiving member disposed in the second recess;
    wherein the second engaging portion comprises a third sub-engaging portion and a fourth sub-engaging portion respectively disposed on the light emitting member and the light receiving member, the first sub-engaging member engages with the third sub-engaging member, and the second sub-engaging member engages with the fourth sub-engaging member.

2. The photo interrupter as claimed in claim 1, wherein the light emitting member comprises a light emitting chip assembly and a first substrate, the light emitting chip assembly is disposed on the first substrate, and the third sub-engaging member is disposed on a surface of the first substrate.

3. The photo interrupter as claimed in claim 2, wherein the first recess has a first surface and a second surface opposite thereto, the light emitting chip assembly contacts the first surface, and the surface of the first substrate contacts the second surface of the first recess.

4. The photo interrupter as claimed in claim 1, wherein the light receiving member comprises a light receiving chip assembly and a second substrate, the light receiving member is disposed on the second substrate, and the fourth sub-engaging member is disposed on a surface of the second substrate.

5. The photo interrupter as claimed in claim 4, wherein the second recess has a first surface and a second surface opposite thereto, the light receiving chip assembly contacts the first surface, and the surface of the second substrate contacts the second surface of the second recess.

6. The photo interrupter as claimed in claim 1, further comprising a first limiting portion and a second limiting portion, respectively disposed on the first housing and the second housing, and respectively abutted to the light emitting member and the light receiving member.

7. The photo interrupter as claimed in claim 6, wherein the light emitting member comprises a light emitting chip assembly and a first substrate, the light receiving member comprises a light receiving chip assembly and a second substrate, and the first limiting portion abuts the light emitting chip assembly, the second limiting portion abuts the light receiving chip assembly.

8. The photo interrupter as claimed in claim 1, wherein the first and second sub-engaging members are hooks, and the third and fourth sub-engaging members are notches.

9. The photo interrupter as claimed in claim 1, wherein the first and second sub-engaging members are protrusions, and the third and fourth sub-engaging members are tracks.

10. The photo interrupter as claimed in claim 1, wherein the housing is formed integrally as a single piece.

11. The photo interrupter as claimed in claim 2, wherein the light emitting chip assembly is disposed on the first substrate by a surface mounting process.

12. The photo interrupter as claimed in claim 4, wherein the light receiving chip assembly is disposed on the second substrate by a surface mounting process.

* * * * *